United States Patent [19]
Hare

[11] 3,986,114
[45] Oct. 12, 1976

[54] WATT-HOUR COUNTER

[75] Inventor: John E. Hare, Erie, Pa.

[73] Assignee: Firetrol, Inc., Erie, Pa.

[22] Filed: May 29, 1975

[21] Appl. No.: 581,617

[52] U.S. Cl. .................................. 324/94; 194/11
[51] Int. Cl.² .......................................... G01R 27/22
[58] Field of Search ............. 324/94, 182; 194/11, 194/9 T

[56] References Cited
UNITED STATES PATENTS

| | | | |
|---|---|---|---|
| 3,064,787 | 11/1962 | Davis | 194/11 |
| 3,302,091 | 1/1967 | Henderson | 324/94 X |
| 3,541,422 | 11/1970 | Paulkovich et al. | 324/94 X |
| 3,778,637 | 12/1973 | Arita | 194/11 X |

FOREIGN PATENTS OR APPLICATIONS

| | | | |
|---|---|---|---|
| 1,260,055 | 1/1972 | United Kingdom | 191/11 |

*Primary Examiner*—Stanley T. Krawczewicz
*Attorney, Agent, or Firm*—Allison C. Collard

[57] ABSTRACT

A watt-hour counter for supplying electrical energy at a remote location from an external power source having a housing with a connection to an external source of electrical power, at least one electrical output mounted externally in the housing and a current measuring means serially connected between the external power source and the electrical output, for producing an output potential proportional to the current at the electrical output. A rechargeable coulometer is coupled to the output of the current measuring means, so that the current sensing means removes a predetermined magnitude of charge from the coulometer proportional to the ampere-seconds used in the external power lines. There is also a charging circuit coupled to the coulometer for charging the coulometer with a predetermined charge, and a switch means serially connected between the external power source and the output, and coupled to the coulometer for interrupting the power to the output in response to a change in potential of the coulometer.

9 Claims, 7 Drawing Figures

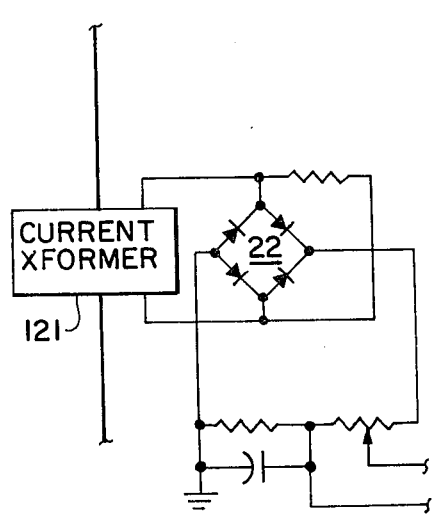
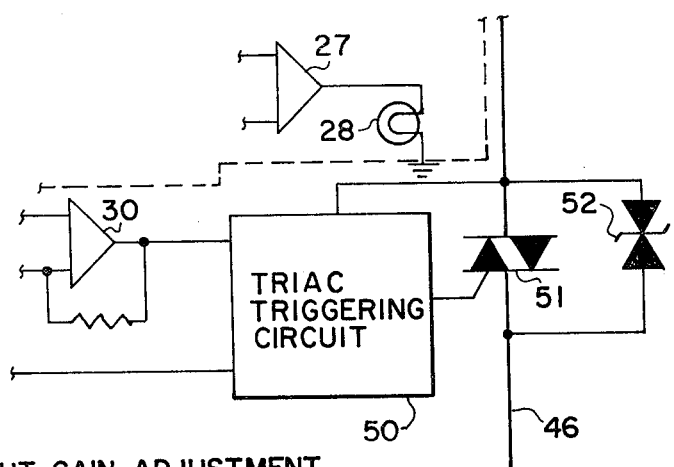
Fig. 5.   Fig. 6.
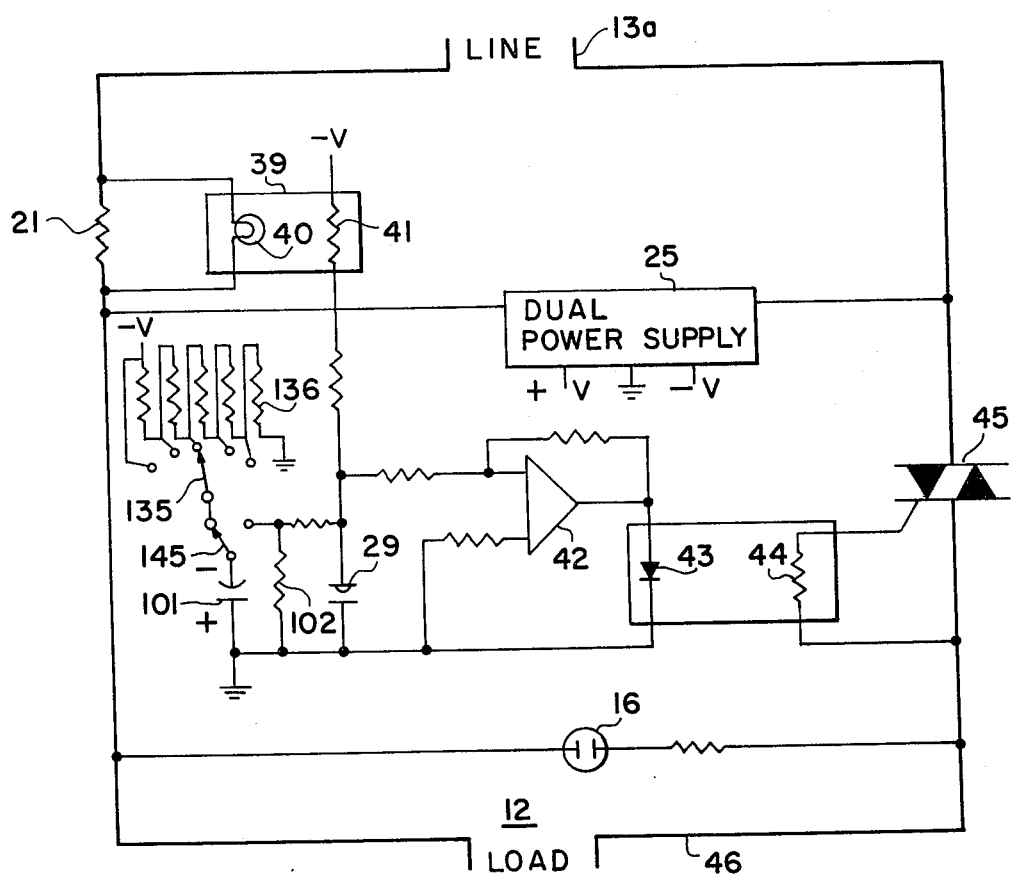
Fig. 7.

WATT-HOUR COUNTER

This invention relates to a watt-hour counter or meter that is capable of distributing and selling a measured amount of energy at a remote location.

More specifically, the present invention relates to a watt-hour counter which is coin operated and will dispense measured quantities of energy in proportion to the number of coins which are inserted into the counter.

In view of the expanding market for remotely situated sources of energy such as at camp sites and marinas, there has developed a great need for dispensing and measuring electrical power for a variety of transient customers. At typical camp sites and marinas, electrical power is provided on a "per day" basis, whereby the user pays a flat rate regardless of whether any energy is consumed. In other instances, meters are provided which have timing devices so that they will operate for a short interval of time such as one-half hour for each coin which is inserted. These meters, however, do not measure the actual wattage which is supplied to the customer but merely the time in which it is supplied so that the customer pays for its availability, regardless of its use.

In other conventional devices, an expensive watt-hour meter is provided having a rotating disc which is geared to an indicating gage so that the actual amount of power can be measured in a manner similar to those found for domestic and industrial use. These type watt-hour meters are expensive and are not readily adaptable for coin operation without tampering with the delicate mechanism of the metering device.

Accordingly, the present invention provides an improved watt-hour counter or meter which measures the actual current supplied to the user over a period of time in response to a coin-operated machine so that the user will pay for the power actually consumed and is not dependent upon any short time interval of use. Once the counter has been operated by the insertion of a coin, a microcoulometer integrates electron flow of the current being supplied to the user and after a predetermined ampere-hours have been used, a power switch will cut off power to the user unless an additional coin is inserted into the meter. The apparatus includes the additional optional feature of having a power cut-off warning light to tell the user that, for example, less than 10% of the usable power is remaining. The apparatus of the invention is constructed to receive standard 110 volt AC power and to provide an outlet socket which is connected in series to a power switch. The power switch located within the metering device is made responsive to the current measuring device.

It is therefore an object of the present invention to provide an improved watt-hour counter which uses a simplified current measuring device in combination with a coin-operated mechanism to provide measured amounts of power at remote locations.

More specifically, the present invention provides a watt-hour meter which is simple in design, easy to manufacture and reliable in operation.

Other objects and features of the present invention will become apparent from the following detailed description considered in connection with the accompanying drawings which disclose the embodiments of the invention. It is to be understood, however, that the drawings are designed for the purpose of illustration only and not as a definition of the limits of the invention.

In the drawings, wherein similar reference characters denote similar elements throughout the several views:

FIG. 5 is an enlarged view of a circuit which can be used to replace a portion of the circuit of FIG. 4;

FIG. 6 is a detailed view of a switching circuit which can be used to replace a portion of the circuit of FIG. 4; and FIG. 7 is a simplified electrical schematic diagram of the apparatus of FIG. 1.

Figure 1:
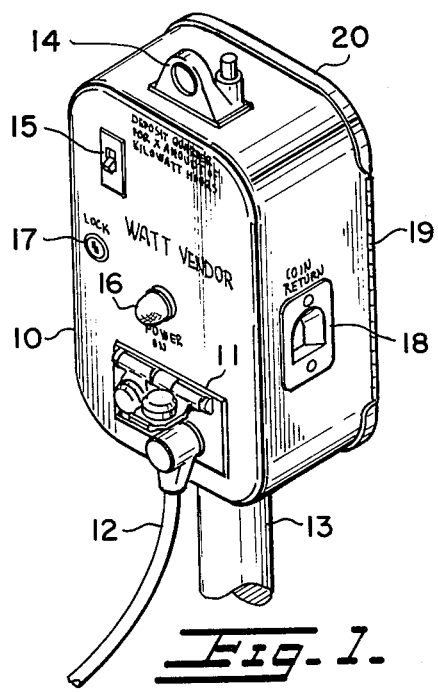
FIG. 1 is a perspective view of the watt-hour counter according to the invention.
Figure 2:
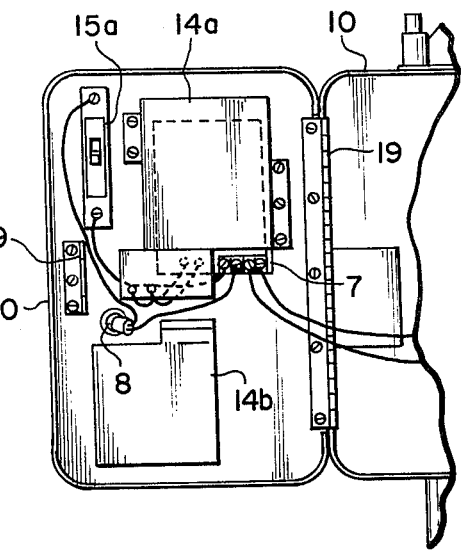
FIG. 2 is a view of the watt-hour counter with its cover open.

Referring to FIGS. 1 and 2, there is shown the watt-hour counter having a cabinet 10 peferably constructed of metal, and a cover 20 enclosing the one open side of cabinet 10. Cover 20 is hinged to cabinet 10 by means of hinge 19 along one edge and cover 20 is secured to the cabinet by means of a lock 17 that is accessible from the front of the cabinet. On the top of the cabinet is provided a coin receiving mechanism 14 which is communicative to a coin return 18 located along the side of the cabinet. The front of the cabinet also includes a power switch 15 which is manually operated, and an indication lamp 16 to indicate when the power is on. Cabinet 10 is preferably secured along its bottom portion to a vertical pole 13 which is preferably secured to a firm support, or cemented into the ground. Pole 13 is preferably a hollow pipe or tube so that electrical power lines can be fed through the hollow pipe into the metering device. The counter also includes a weatherproof electrical outlet 11 so that one or more extension cords or plugs can be connected by raising the weatherproof spring-loaded caps on the electrical outlet.

With the cover of the apparatus open as shown in FIG. 2, there is disclosed the coin-accepting mechanism 14a which covers a printed circuit 7 containing the electrical circuitry which operates the invention. Mounted in the back cover is also provided a power input lamp 8 which is connected to a circuit breaker 15a. Circuit breaker 15a is designed to interrupt the power going to the output 11 if the current exceeds a predetermined high valve such as 20 amps. Below the coin-accepting mechanism is a coin box 14b for collecting the coins. The apparatus also includes an L-shaped latch 9 which is bolted to cover 20 and designed to receive lock mechanism 17 in order to secure the cover to cabinet 10.

Figure 3:
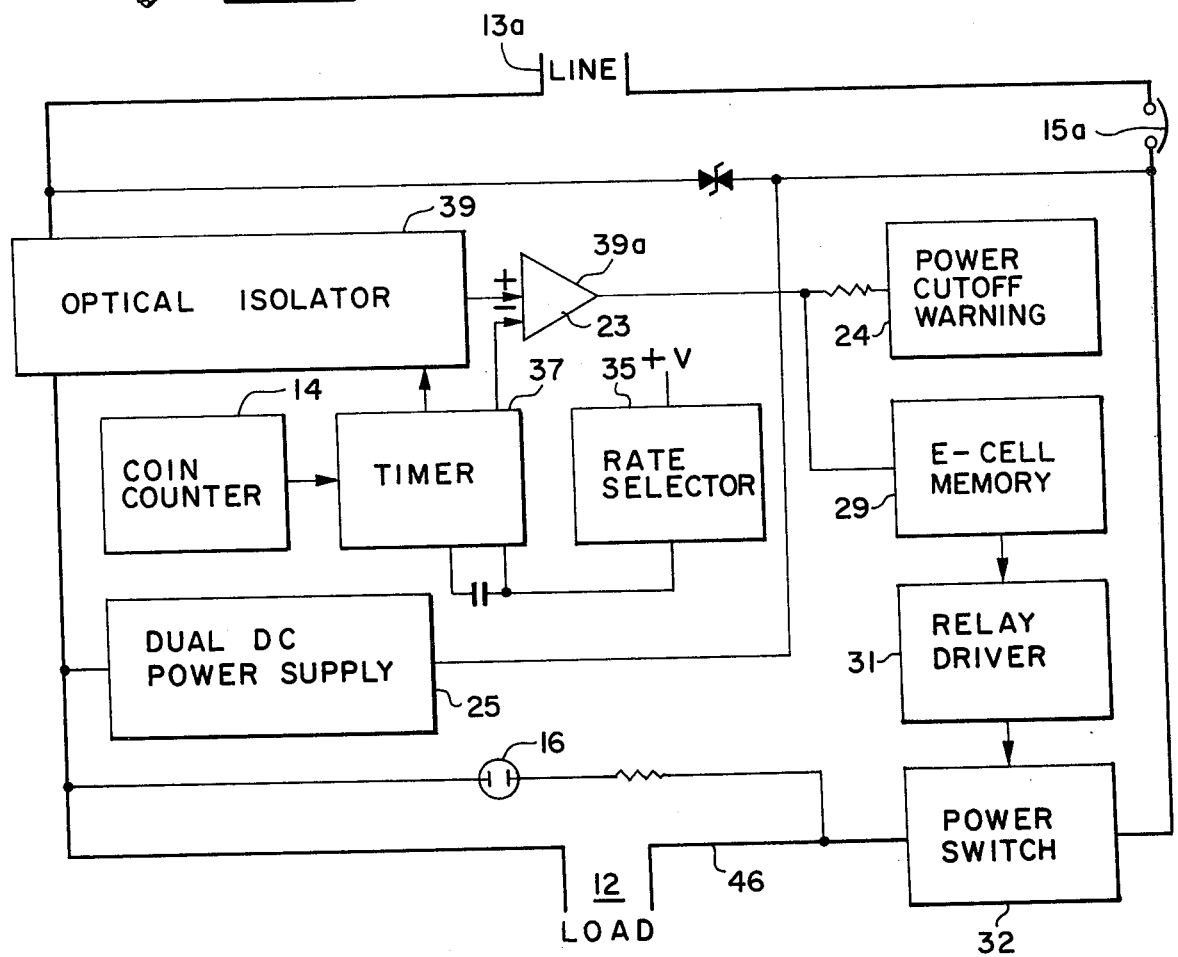
FIG. 3 is an electrical block diagram of one embodiment of the circuit of the apparatus of FIG. 1.

Referring to FIG. 3, there is shown one embodiment of a circuit according to the invention having an input power line 13a having one side directed through circuit breaker 15a and coupled through a power switch 32 to output line 46 of load line 12.

The other side of power line 13a is connected through an optical isolation circuit 39. In this embodiment, the optical isolator may consist of a resistor 21 as shown in detail in FIG. 7 connected in series with line 13a and having a low voltage lamp 40 connected across the resistor. A photocell 41 is placed in the optical path of lamp 40 so that as the voltage drop across resistor 21 increases due to increased current, the lamp will become brighter and the photocell will produce a greater output voltage in response to the increased brightness of the lamp. The output of the optical isolator is connected to a microcoulometer labeled as an "E-cell 29." The E-cell, which is described in U.S. Pat. No. 3,387,288, integrates the electron flow in either direction, and retains the last charge in its memory indefinitely. Whenever the integral in the memory is made zero or cleared, the component changes state providing an electrical trigger signal. The E-cell consists of a silver case which serves as an electrode, a reservoir of active silver, and a container for the electrolyte. The electrolyte serves as the vehicle for an ion conduction between the electrodes, the other electrode being preferably gold. For each electron entering the cell, one atom of silver is electroplated on or off the gold-working electrode. When the integral is zero, all the silver has been removed from the gold-working electrode so that no further ion conduction can occur, and the E-cell integrator becomes an electrical open circuit. Upon reaching its open circuit, the voltage rises rapidly from a very low voltage to approximately 1.2 volts. The output of the E-cell is connected to a relay driver 31 which in turn is connected to the power switch 32 which is designed to interrupt the line and break the electrical connection to the load 12 when the E-cell becomes open circuited.

As shown in FIG. 3, coin counter 14 is coupled to a timer circuit 37 which is controlled by a rate selector 35. The rate selector consists of a variable resistance circuit so as to permit the operator of the apparatus to select an electrical sales rate per kilowatt hour for the operation of the apparatus. The output of the timer and the output of the optical isolator are connected to the input of a summing amplifier 23 which has its output 39a connected to the E-cell memory 29. If, for example, a coin is inserted into coin counter 14, it will operate the timer so that a charge will be applied to the E-cell memory for a short interval of time in order to make the E-cell memory conductive. Then, as the power is supplied to load 12, a charge of opposite polarity will be generated at the output of the optical isolator so as to draw current in an opposite direction through the E-cell memory until the memory cuts off and trips the power switch, interrupting the power to the load. The rate at which the charge of opposite polarity is applied to the E-cell will be proportional to the current drawn by the load. A DC power supply 25 is also included in the circuit of FIG. 3 to provide DC power to operate the various circuits such as the timer, rate selector and the E-cell memory.

Figure 4:
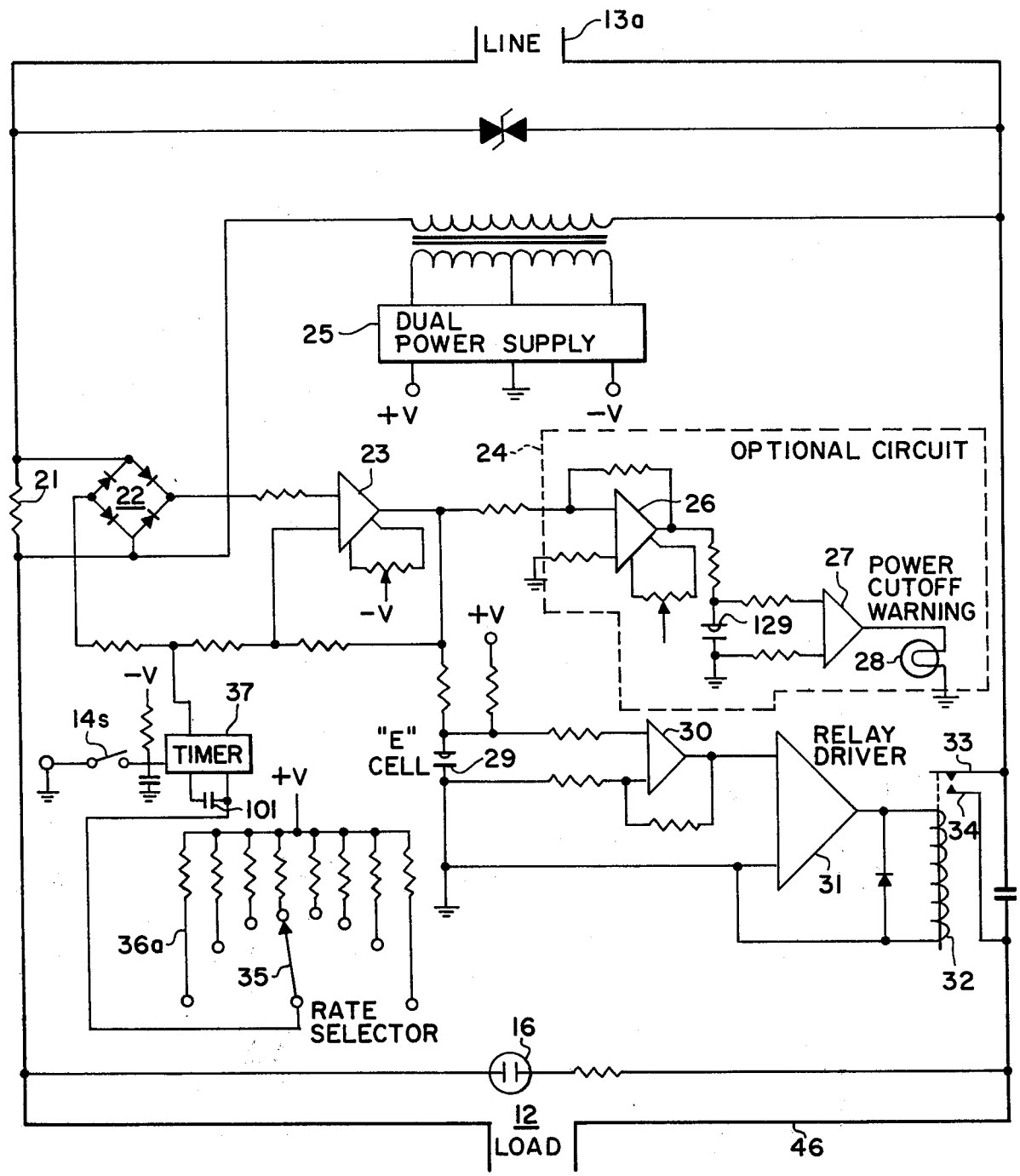
FIG. 4 is a detailed electrical schematic diagram of the watt-hour counter of FIG. 1.

Referring to FIG. 4, a more detailed circuit is disclosed in which the optical isolator is replaced by a resistor 21 and a diode bridge rectifier 22 which produces a DC output voltage proportional to the voltage drop across resistor 21. The output of bridge rectifier 22 is connected to one input of amplifier 23. The other input amplifier 23 is connected to timer circuit 37 which is controlled by rate selector 35. Rate selector 35 in this particular embodiment consists of a plurality of stepped resistors 36a of different value which will control, through an R-C circuit, the time in which the charge of opposite polarity is applied to E-cell 29 in order to charge the E-cell after a coin has been dropped into the apparatus. In response to each coin which is dropped into slot 14 of the apparatus, a switch 14s is closed momentarily so that the charge in timer 37 is applied through amplifier 23 to E-cell 29 in order to transfer silver to the gold-working electrode on the E-cell in controlled amounts. Connected across the output of E-cell 29 is a threshold amplifier 30 which drives a relay amplifier 31 connected at its output to coil 32 of the relay. When the E-cell becomes fully discharged, such as when all of the silver has been removed from the gold-working electrode, the potential across the E-cell will increase to a maximum of 1.2 volts and operate threshold amplifier 30 which will turn on relay driver 31 to open contacts 33 and 34 and interrupt the power in power line 46.

Power cut-off warning circuit 24 is also shown in more detail as an optical circuit having an amplifier 26 which is connected to the input of a second E-cell 129. By means of adjusting the resistors and the gain of amplifier 26, the charge applied to E-cell 129 is set to be slightly less than that applied to E-cell 29 so that E-cell 129 will become an electrical open circuit sooner than E-cell 29 and thus provide an input to amplifier 27 in order to operate warning light 28. In a preferable adjustment, power warning light 28 can be made to turn on when only 10 or 15% of the power is left in the circuit.

FIG. 5 discloses another embodiment of a current measuring input circuit, whereby resistor 21 of the circuit of FIG. 4 is replaced by a current transformer 121 which has its output connected to bridge rectifier 22. The advantage of a current transformer 121 over a resistor 21 is that there is very little or no voltage drop caused by the metering circuit as its load is increased.

FIG. 6 discloses a replacement circuit for relay driver 31, wherein a triac triggering circuit 50 is connected to the output line and includes a triac 51 connected in series to the output line so that when E-cell 129 is discharged and raises to a high level of voltage, amplifier 30 will operate the triac triggering circuit to interrupt the triac and disconnect the power from line 46. A protective circuit 52 consisting of a GE 130 volt diode surge circuit is connected across triac 51 to prevent voltage transients from damaging triac 51.

FIG. 7 discloses a simplified electrical metering circuit which requires a mininum number of parts. The current sensing means employs an optical integrator similar to that shown in FIG. 3 wherein the output of photocell 41 is connected to E-cell 29. A timing circuit consisting of a capacitor 101 and resistor 102 are connected across E-cell 29 so that when a coin is dropped into coin box 14, switch 14s will apply the charge stored from rate selector 135 to E-cell 29 in order to set the rate for the amount of kilowatt hours which can be drawn from the circuit. The output of E-cell 29 is connected to a driver amplifier 42 which drives a photo diode 43 which is disposed in the optical path of a photosensitive resistor 44. When E-cell 29 becomes open circuited and its potential rises to 1.2 volts, amplifier 42 will turn on diode 43 which will change the electrical resistance of photosensitive resistor 44 and cause triac 45 to interrupt the power in output line 46.

It is obvious from the above discussion that the apparatus of the above invention may take several forms due to different circuits which may be used. For example, the current measuring circuit may also consist of a monolithic converter which relies on heat transfer to a transistor which will drive the E-cell, the heat transfer being dependent upon the current being supplied to the customer.

The cabinet and its cover are preferably constructed of a rigid metal material such as cast aluminum or steel.

The electronic circuitry is preferably semiconductor diodes, triacs and transistor amplifiers mounted on printed circuit boards for easy maintenance and assembly.

While only a few embodiments of the invention have been shown and described, it is obvious that many changes and variations may be made thereunto without departing from the spirit and scope of the invention.

What is claimed is:

1. A watt-hour counter for supplying electrical energy at a remote location from an external power source comprising:
    a housing having a connection to an external source of electrical power;
    at least one electrical output mounted externally in said housing;
    current measuring means serially connected between the external power source and said electrical output, for producing an output potential proportional to the current in said electrical output;
    a rechargeable coulometer coupled to the output of said current measuring means, said current measuring means removing a predetermined magnitude of charge from said coulometer proportional to the ampere-seconds used in said external power lines;
    a charging circuit coupled to said coulometer for charging said coulometer with a predetermined charge; and
    switch means serially connected between said external power source and said output and coupled to said coulometer for interrupting the power to the output in response to a change in potential of said coulometer.

2. The watt-hour counter as recited in claim 1 wherein said current measuring means comprises a resistor placed in series in said external power line and a potential sensing means coupled across said resistor for providing a DC potential to said coulometer proportional to the voltage drop across said resistor.

3. The watt-hour counter as recited in claim 2 wherein said potential sensing means comprises an illumination device for producing a light intensity proportional to the voltage drop across said resistor, and photoconductive means for producing an output poential proportional to the illumination of said lamp.

4. The watt-hour counter as recited in claim 1 wherein said current measuring means comprises a current transformer for producing an output potential proportional to the magnitude of current in said external line.

5. The watt-hour counter as recited in claim 2 wherein said charging circuit comprises a timer having a variable resistance for selecting different rates of charge to be applied to said coulometer.

6. The watt-hour counter as recited in claim 1 wherein said switch means comprises a triac serially connected between said external power source and the output, and a trigger circuit coupling said triac to said coulometer so that a change of potential in said coulometer will interrupt the external power source.

7. The watt-hour counter as recited in claim 1 additionally comprising a coin-operated mechanism coupled to said charging circuit for applying a charge to said coulometer proportional to the number of coins inserted in said coin-operated mechanism.

8. The watt-hour counter as recited in claim 1 wherein said switch means comprises a relay serially connected between said external power source and the output of said meter, and a relay driver coupling said coulometer to said relay.

9. The watt-hour counter as recited in claim 1 wherein said coulometer comprises an E-cell.

* * * * *